United States Patent [19]

Lee

[11] Patent Number: 5,862,087
[45] Date of Patent: Jan. 19, 1999

[54] REDUNDANCY CIRCUIT FOR MEMORY DEVICES HAVING HIGH FREQUENCY ADDRESSING CYCLES

[75] Inventor: Seung-Hun Lee, Suwon, Rep. of Korea

[73] Assignee: Samsung Electronics, Co., Ltd., Suwon, Rep. of Korea

[21] Appl. No.: 766,562

[22] Filed: Dec. 13, 1996

[30] Foreign Application Priority Data

Dec. 18, 1995 [KR] Rep. of Korea .................. 1995 51503

[51] Int. Cl.[6] ..................................................... G11C 7/00
[52] U.S. Cl. ....................................... 365/200; 365/225.7
[58] Field of Search ................................ 365/200, 225.7, 365/189.11

[56] References Cited

U.S. PATENT DOCUMENTS

| | | | |
|---|---|---|---|
| 5,058,059 | 10/1991 | Matsuo et al. | 365/200 |
| 5,495,446 | 2/1996 | Teel et al. | 365/225.7 |
| 5,574,689 | 11/1996 | Morgan | 365/200 |
| 5,590,085 | 12/1996 | Yuh et al. | 365/225.7 |
| 5,677,882 | 10/1997 | Isa et al. | 365/200 |

*Primary Examiner*—Son T. Dinh
*Attorney, Agent, or Firm*—Marger, Johnson, & McCollom, P.C.

[57] ABSTRACT

A redundancy circuit for activating redundant memory cells when a semiconductor memory device is found to have defective memory cells, which redundancy circuit comprises, in order to overcome the problems of an address reset and a precharging of the first node which determines the redundancy addressing output signal of the redundancy circuit, additional switching circuit which is controlled by a clock signal of the memory device being made to be connected between a ground node and a switching circuit connected to a plurality of fuses, and a precharging circuit for precharging the first node to a high voltage level being made to also controlled by the clock signal.

38 Claims, 5 Drawing Sheets

5,862,087

REDUNDANCY CIRCUIT FOR MEMORY DEVICES HAVING HIGH FREQUENCY ADDRESSING CYCLES

FIELD OF THE INVENTION

The present invention generally relates to a semiconductor memory circuit, and more particularly to a redundancy circuit for activating redundant memory cells in place of defective elements in normal memory cells, which redundancy circuit is suitable for use in memory devices such as asynchronous memory devices where addressing is performed at high speed.

BACKGROUND OF THE INVENTION

As well known in the art, a semiconductor memory device has awfully many memory cells arranged in rows and columns, and the memory cells are grouped into a number of memory arrays. With the increase of the integration of electronic systems, the density of the memory device is also increased. Accordingly, an area that can be occupied by a single memory cell becomes smaller. In the high density memory device, a redundancy technology is commonly utilized to improve production yield.

The redundancy technology is to provide spare or redundant memory cells which can replace any defective elements in regular memory cell arrays. During electrical tests of a memory device, the defective memory cells are identified and the redundant cells, which are also arranged in rows and columns, are activated in place of the defective elements. In case of a column redundancy circuit, a defective cell in the regular memory cells can be replaced by decoding column address associated with the defective element and by activating only a redundant memory cell. Whether the redundant cells are to be activated or the regular nondefective memory cells are to be activated can be determined by using a fuse circuit (or a redundancy circuit), which is divided into two: a dynamic type fuse circuit as shown in FIG. 1, and a static type as shown in FIG. 3.

In present, the dynamic fuse circuit has been used as a row redundancy circuit for repairing any defective memory cells by decoding row addresses in a synchronous memory device as well as an asynchronous device (though in this device, the row addresses are activated synchronously with a reference signal or Row Address Strobe signal). On the other hand, the latter static fuse has been used in both a column and a row redundancy circuits.

FIG. 1 is a circuit diagram of a conventional dynamic fuse circuit used in a memory device. Referring to FIG. 1, the dynamic fuse circuit comprises two P-channel type metal oxide semiconductor (PMOS) transistors 1_1 and 1_2, and an inverter 3_1, a plurality of fuses f1 to fn, a switching circuit and an output driving circuit. The PMOS transistors 1_1 and 1_2 together with the inverter 3_1 act as a precharging element for precharging a node ND1 to a high voltage level (Vcc) when an external clock signal CLK in a synchronous memory device (or RAS in case of an asynchronous device) remains in a low voltage level. Each of the fuses f1 to fn is connected in parallel to the node ND1 at its one end. The switching circuit comprises a corresponding number of NMOS transistors to the fuses, each of NMOS transistors has a source connected to a ground voltage Vss, a drain connected to the other end of each of the fuses, and a gate electrode to which row address signal A1, /A1, A2, /A2, ..., Am and /Am are applied, where '/' presents a complementary signal, i.e., if A1 is high, then /A1 must be low, and vice verse. The output driving circuit provided with two serially connected inverters 3_2 and 3_3 is to buffer or amplify the voltage signal placed on node ND1 and to output a row redundancy addressing signal REDn for activating a selected redundant memory cell.

FIG. 2 shows a timing diagram of the conventional dynamic fuse circuit of FIG. 1. With reference to FIGS. 1 and 2, the operation of the dynamic fuse circuit will be described in detail.

When the clock signal CLK or RAS is in low voltage level, the PMOS transistor 1_1 conducts, which allows the node ND1 to go high its precharing level Vcc. If a memory cell is found to be defective, some fuses corresponding to the address of the defective memory cell must be opened or cut-off by using, e.g., a laser cutting method. As an example, if the defective memory cell has a row address of A1, A2, A3, ..., Am-1 and Am being '011 ... 11', among the fuses, f2 and f3, f5, f7, ..., f(n-1) must be cut off. In other word, the fuses connected NMOS transistors receiving address bits including the complementary signals which have logical value of '1' (i.e., high voltage level) must be cut off. This is to make the node ND1 and ground Vss be disconnected, resulting in the high voltage level of ND1. When the address signal is active, the clock signal CLK remains high, which causes the PMOS transistor 1_1 to turn off. However, the high voltage level of ND1 can be maintained by a latch circuit consisted of the inverter 3_1 and the PMOS transistor 1_2, because the positive electrical charges are continuously supplied to ND1 through the conduction of PMOS transistor 1_2. When the ND1 remains high, the row redundancy addressing signal REDn outputs high voltage signal, so that the defective row is deactivated and the redundancy row is addressed.

Of course, if there is no defective memory cell, the fuse cutting will not be done. At this time, because at least one of the NMOS transistors 2_1 to 2_n turn on, the node ND1 is discharged to Vss. As a result, from the output driving circuit 3_2 and 3_3 is out a low redundancy addressing signal REDn, so that no redundancy memory cell is selected.

The dynamic fuse circuit explained above has a relatively small layout area, but the precharging action of the node ND1 should be followed by each of address reset operation after CLK goes low. This inevitably limits the application of the dynamic fuse circuit to such a memory device having high speed address input, i.e., having a very short or no address reset time as in asynchronous memory devices.

FIG. 3 is a circuit diagram of a conventional static type fuse circuit used in memory devices. The static fuse circuit comprises a number of fuses f1–fn, of which two adjacent fuses are connected together, COMS transmission gates, a transmission gate control circuit, a switching circuit, and an output logic circuit. The COMS transmission gates 11_1/12_1, 11_2/12_2, ..., 11_n/12_n have conduction paths between the fuses and address input nodes A1, /A1, A2, /A2, ..., Am and /Am. The transmission gate control circuit comprises a master fuse fm, a PMOS transistor 14, NMOS transistors 16_1 and 16_2, and inverters 14_1 to 14_4. The switching circuit is a plurality of NMOS transistors 17_1 to 17_m, each having a gate electrode connected to node ND2, and a source and a drain connected to a pair of fuses (i.e., two adjacently connected fuses) and to the ground terminal Vss, respectively. The output logic circuit comprises NAND gates 18_1, 18_2 and 18_3, NOR gates 19_1 and 19_2, and an inverter 14_5. Inputs of the output logic circuit are connected to drains of the switching circuits 17_1 to 17_m, so that if all of the drains are high voltage levels, an output signal REDn goes high, while if any one of the drains goes low the output REDn of the output logic circuit is converted to a low voltage. When the output REDn remains high, a row or a column redundancy addressing signal is active, and therefore corresponding word line or bit line of redundant memory cells is activated. Of two adjacent CMOS transmission gates, PMOS transistors (e.g., 11_1 and 11_2) have gate electrodes commonly connected to node ND2, and NMOS transistors (e.g., 12_1 and 12_2) have gate electrodes connected to an output of an inverter 14_4 which reverts the voltage level of node ND2.

With this structure of static fuse circuit, when the redundant memory cells are to be used in place of defective memory cells, the fuses associated with low '0' address signals of the defective address bits (A1, /A1, ..., Am and /Am) must be cut off on the contrary to the dynamic fuse circuit. For example, if the row address bits of a defective memory cell is '01 ... 11', then fuse f1 and fuses f4, f6, f8, ..., and fn (i.e., fuses having even numbered subscripts) must be cut off, while the fuses f2, f3, f5, f7, ... and f(n−1) are not opened. That is to say, what is to be cut off are fuses connected to the transmission gates which receive address bits of '0' including the complementary address signals.

The master fuse fm prevents the collision of two complementary signals (e.g., A1 and /A1) through two adjacently connected transmission gates when the redundant memory cells activated by the static fuse circuit are not to be used, i.e., when there are no defective memory cells.

When the static fuse circuit is not to be used, all of the fuses f1 to fn (here-in-after referred to as 'slave fuses') and the master fuse fm are in closed states. Therefore, if an initiating signal $V_{INIT}$ is supplied, the node ND2 goes high through the conduction of PMOS transistor 14 of the transmission gate control circuit. This causes the transmission gates 11_1 to 11_n and 12_1 and 12_n to turn off, and the switching transistors 17_1 to 17_m to turn on. As a result, drain nodes of all of the switching transistors 17_1 to 17_m go low, which allows the output logic circuit to output a low leveled redundancy addressing signal REDn.

FIG. 4 is a timing diagram of various signals used in the conventional static fuse circuit.

As explained before, when the redundant memory cells are to be used half the slave fuses connected to the transmission gates and the master fuse fm are opened by e.g., a laser cutting method. If the initiating signal $V_{INIT}$ remains low, NMOS transistors 16_1 and 16_2 of the transmission gate control circuit turn on, and hence the node ND2 goes low. Accordingly, all of the transmission gates turn on, while the NMOS switching transistors 17_1 to 17_m turn off.

On the other hand, if an address signal for normal non-defective memory cell (e.g., '10 ... 01') is input, at least one low address bit is placed on a corresponding drain node of the NMOS transistors 17_1 to 17_m through a non-opened fuse. Accordingly, the output logic circuit supplies low leveled, i.e., inactive row redundancy addressing signal REDn, so that the normal word line corresponding to the input address signal is activated.

When defective address signal (e.g., '01 ... 11') is supplied, high address bits (e.g., '/A1, A2, A3, , Am) place high voltage on all of the drain nodes of the NMOS transistors 17_1 to 17_m, which causes all of the NAND gates 18_1 to 18_m to receive high inputs, so that the output of the output logic circuit REDn becomes active high.

Next, when the initiating signal $V_{INIT}$ goes high, NMOS transistors 16_1 and 16_2 of the transmission gate control circuit turn off, but the node ND2 still remains low due to the cut off master fuse fm together with the latching action of the transistor 16_2 and the inverter 14_2. Accordingly, the transmission gates are all turned on and on the contrary the switching NMOS transistors 17_1 to 17_m are all turned off. In this state, if the defective address signal URA for redundant memory cell is input, at least one of the drain nodes of the NMOS transistors 17_1 to 17_m receives high address bit through the closed fuse, which causes the output logic circuit to output low redundancy addressing signal REDn.

On the other hand, when defective address signal ('01 ... 11') is input with maintaining the signal $V_{INIT}$ to be high, high address bits ('/A1, A2, A3, ..., Am') are delivered to all of the drain nodes of the switching transistors 17_1 to 17_m, and hence the redundancy addressing signal REDn goes high.

As explained so far, because the static fuse circuit dislike the dynamic fuse circuit need not to reset the address signal or to precharge a certain node which determines the voltage value of the redundancy addressing signal, it can be properly used in high speed memory devices such as synchronous DRAM and SRAM in which the addressing is preformed at high frequency. However, it has critical drawback in that the layout is much larger than the dynamic fuse circuit.

SUMMARY OF THE INVENTION

In the light of the drawback of the prior art, it is an object of the present invention to provide a redundancy circuit having small layout size and applicable to high speed addressing memory devices.

In order to overcome the problems of an address reset and a precharging of the first node which determines the redundancy addressing output signal of the redundancy circuit, additional switching circuit which can be controlled by a clock signal of a memory device is made to be connected between a ground node and a switching circuit connected to a plurality of fuses, and a precharging circuit for precharging the first node to a high voltage level is made to also controlled by the clock signal.

With this structure, it is possible to precharge the first node when the clock signal remains in the second voltage level (e.g., low voltage level) and to control that the precharged level on the first node is transferred as it were or as being changed to a ground low voltage level to the redundancy addressing output signal when the clock signal remains in the first voltage level (e.g., high voltage level) by using a plurality of fuses is which predetermined some fuses are cut off for identifying an input address signal for selecting a defective memory cell. The transfer of signal from the first node to the output is performed by a transmission gate which is also controlled by the clock signal.

According to one aspect of the present invention, there is provided a redundancy circuit comprising: the first node for determining a voltage level of a redundancy addressing output signal; a plurality of fuses each connected to the first node in parallel; the first switching circuit for disconnecting the first node and the third node when an address signal for the defective memory cells is input, the first switching circuit being connected between the third node and the plurality of fuses and receiving an address signal of multi bits; a precharging circuit for precharging the first node to the first voltage level depending on a voltage level of a control signal of the semiconductor memory device, the precharging circuit being connected between the first node and a second node receiving the first voltage level; the second switching circuit for determining a voltage level of the first node, the second switching circuit being connected to the third node and receiving the control signal; and a transmission gate for transferring the voltage level of the first node to the redundancy addressing signal depending on the voltage level of the control signal.

According to another aspect of the present invention there is provided a redundancy circuit comprising: the first node for determining a voltage level of a redundancy addressing output signal; an internal control signal generating circuit for generating an internal control signal upon receiving the first control signal of the semiconductor memory device; a precharging circuit for precharging the first node to a first voltage level depending on the internal control signal and on the second control signal of the memory device, the precharging circuit being connected between the first node and the second node receiving the first voltage level; the first switching circuit connected between the first node and the third node receiving a ground voltage level, the first switching circuit receiving the internal control signal; a plurality of fuses each connected to the first node in parallel; a second switching circuit for disconnecting the first node and the fourth node when an address signal for the defective memory cells is input, the second switching circuit being connected between the fourth node and the plurality of fuses and receiving an address signal of multi bits; the third switching circuit connected between the third and the fourth nodes and receiving the second control signal; a transmission gate for connecting the first node to the fifth node depending on the voltage level of the second control signal; the fourth switching circuit, connected to the fifth node, for connecting the third and the fifth nodes depending on the voltage level of the first control signal; and a latching circuit for maintaining the voltage level of the fifth node.

BRIEF DESCRIPTION OF ATTACHED DRAWINGS

Other objects of the present invention will become apparent as the following specification progresses, reference being had to the accompanying drawings for an illustration of the present invention, in which.

DETAILED DESCRIPTION OF PREFERRED EMBODIMENT

<The First Embodiment>

Figure 5:
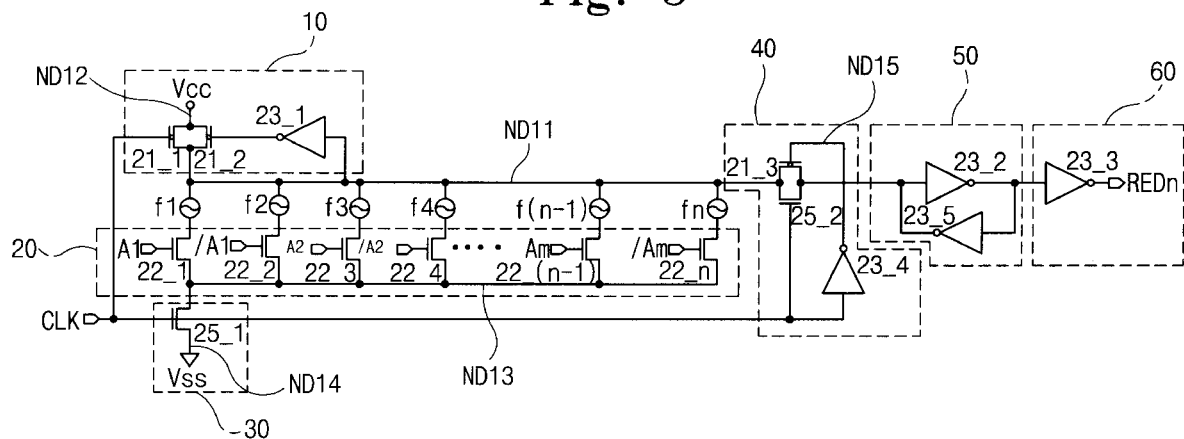
FIG. 5 is a circuit diagram of a redundancy circuit according to an embodiment of the present invention.
Figure 6:
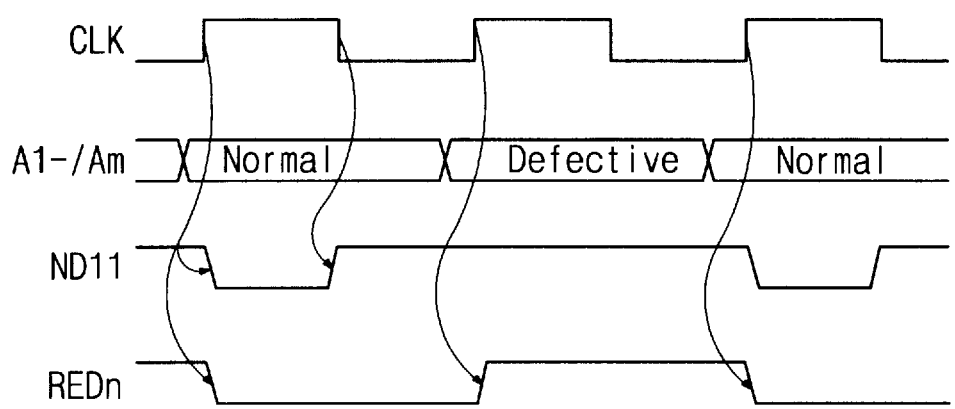
FIG. 6 is a timing diagram of various signals of the redundancy circuit of FIG. 5.

FIGS. 5 and 6 show an embodiment of the present invention. Referring to FIG. 5, the redundancy circuit of this invention comprises a precharging circuit 10, a plurality of fuses f1 to fm, the first switching circuit 20, the second switching circuit 30, a transmission gate 40, a latching circuit 50, and an output driving circuit 60.

The precharging circuit 10 is connected to the first node ND11 and the second node ND12 to which power supply voltage Vcc is supplied. When clock signal CLK goes to a low Vss voltage level, the first node ND11 is precharged to high voltage level through the conduction of PMOS transistor 21_1. The plurality of fuses f1 to fm are connected in parallel between the first node ND11 and the first switching circuit 20.

The first switching circuit 20 is connected between the third node ND13 and the fuses f1 to fm, and determines the electrical interconnection of the node ND13 and the fuses depending on address input signals 'A1, /A1, A2, /A2, ..., Am and /Am'. The second switching circuit 30 which is connected between the node ND13 and the fourth node ND14 receiving ground voltage signal Vss is to electrically interconnect the third and fourth nodes ND13 and ND14 when the clock signal CLK goes high. On the other hand, the transmission gate 30 is to couple the first and the fifth nodes ND11 and ND15 when receiving high clock signal CLK.

The latching circuit 50 and the output driving circuit 60 are serially connected between the fifth node ND15 and the output terminal supplying redundancy addressing signal REDn. The latching circuit 50 is to maintain or to latch the input signal which has been supplied to the output driving circuit 60 prior to the first and the fifth nodes ND11 and ND15 being disconnected by the transmission gate 40.

Figure 1:
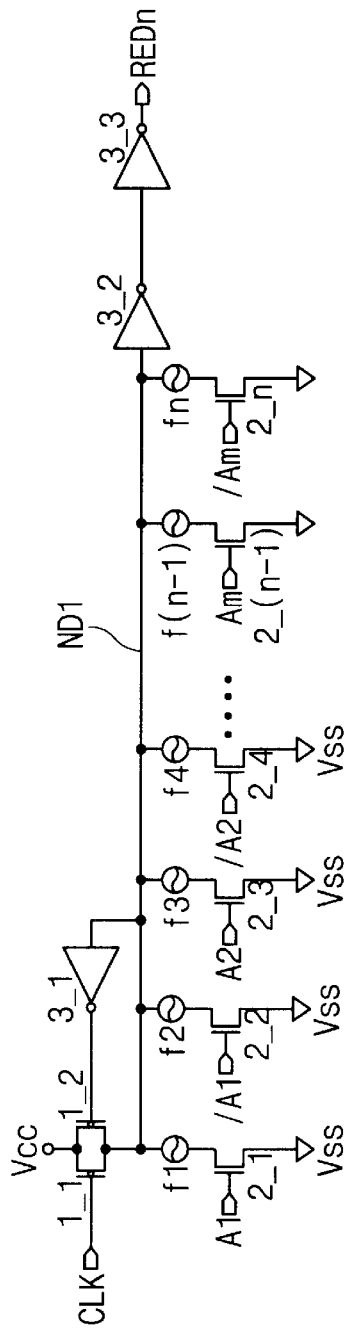
FIG. 1 is a circuit diagram of a conventional dynamic fuse circuit used as a redundancy circuit.
Figure 2:
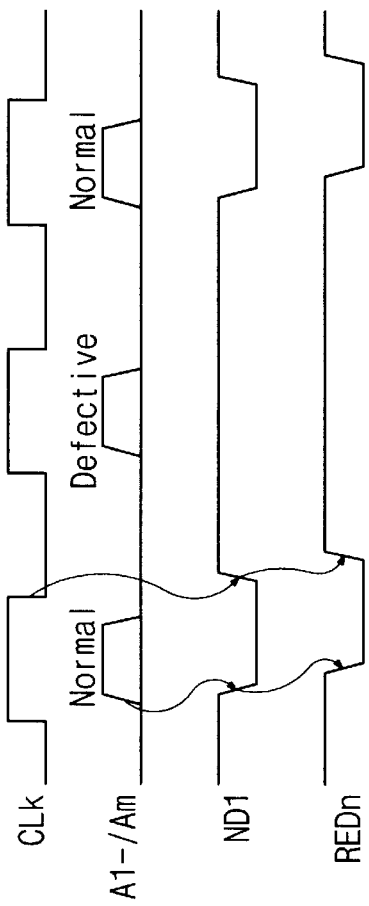
FIG. 2 is a timing diagram of various signals of the dynamic fuse circuit of FIG. 1.

In FIG. 5, elements corresponding to those of FIG. 1 use similar reference numerals, e.g., the element 1_1 used in FIG. 1 corresponds to an element 21_1. Comparing FIG. 5 with FIG. 1, it can be understood that two switching circuits 20 and 30 and a latching circuit 50 are added to the conventional fuse circuit. Hence, the description will be focused on the additional constitutional elements.

The second switching circuit 30 comprises a NMOS transistor 25_1 which has a drain connected to all sources of NMOS transistors 22_1 to 22_n of the first switching circuit 20, a source connected to Vss, and a gate receiving the clock signal CLK.

The transmission gate 40 comprises an inverter 23_4 and a COMS transmission gate connected between the first and the fifth nodes ND11 and ND15, in which the clock signal CLK is supplied both to the gate of NMOS transistor 25_2 and to the input of the inverter 23_4, and the output of the inverter 23_4 is connected to the gate of PMOS transistor 21_3.

The latching circuit 50 comprises two inverters; one 23_2 is connected between the input terminals of ND15 and of the output driving circuit 60, the other 23_5 connected to the inverter 23_3 in parallel but in opposite direction.

Referring to FIGS. 5 and 6, when the clock signal CLK remains low, the PMOS transistor 21_1 turns on and hence the node ND11 goes to its high precharging level Vcc. On the other hand, if a redundant memory cell is to replace a defective memory cell, corresponding some fuses among the plurality of fuses f1 to fn are cut off. As in the example of the conventional fuse circuit, suppose that the defective memory cell has a row address of '01 ... 11'. Then, fuses (f2 and f3, f5, f7, ... ,f(n–1)) connected to NMOS transistors 22_1 to 22_n which receive high address bits including the complementary bits must be cut off. This is to prevent the interconnection of the node ND11 and the node ND13, when the defective address signal is input, i.e., when the defective memory cell is addressed.

On the contrary, if a memory device has good memory cells and no defective cell is found, none of the fuses f1 to fn is cut off. Therefore, when the clock signal CLK is in high voltage level and address signal for normal memory cell is supplied, half the NMOS transistors 22_1 to 22_n of the first switching circuit 20 turn on, which causes the first node ND11 goes to Vss. And, in this state (i.e., during the clock signal CLK remains high), the transistors 21_3 and 25_2 of the third switching circuit 40 turn on. This makes the signal on node ND11 be transferred to the fifth node ND15 and the node ND15 remains 'low'. As a result, the output driving circuit 60 outputs low voltage of redundancy addressing signal REDn. If the clock signal CLK transits, without a reset cycle of the address signal, to low voltage level during the output driving circuit 60 outputs low signal REDn, PMOS transistor 21_1 of the precharging circuit 10 turns on and transistors 25_1, 21_3 and 25_2 of the second switching circuit 30 and the transmission gate 40 turn off. This causes the first node ND11 to be precharged high, but the voltage on ND11 cannot be transferred to the fifth node ND15. As a result, the fifth node ND15 maintains low voltage level by the latching circuit 50 regardless of the voltage change placed on the first node ND11, so that the redundancy addressing signal REDn can remain low and thus the redundant memory cell is not activated.

With ND11 precharged high and CLK being high, when defective address signal RA is input to the gates of transistors 22_1 to 22_n of the first switching circuit 20, the first node ND11 remains high. The reason is that fuses connected to transistors 22_1 to 22_n which receive high address bits including the complementary bits has been cut off and therefore the first node ND11 is disconnected to ND13 and to ground Vss. When both CLK and ND11 remain high, PMOS transistor 21_2 of the precharging circuit 10 and PMOS transistor 21_3 of the transmission gate 40 turn on, which allows the nodes ND11 and ND15 to be connected and the fifth node ND15 to go high. As a result, the redundancy addressing signal REDn goes high and corresponding redundant memory cell is activated.

Next, when the clock signal CLK goes low without address reset action while remaining REDn to be high, the PMOS transistor 21_1 of the precharging circuit 10 turns on to make ND11 go high. However, the first and the fifth nodes ND11 and ND15 are disconnected by the turned off transistors 25_1, 21_3 and 25_2. Accordingly, the fifth node ND15 maintains its previous voltage level by way of the latching circuit 50 independently of the voltage level of the first node ND11. As a result, the redundancy addressing signal REDn remains high as before, and what is addressed is the redundant memory cell.

With the node ND11 and ND15 being high, when the unrepaired normal address is input to the first switching circuit 20 and the clock signal CLK goes high, the first node ND11 becomes low, because the transistors of the precharging circuit 10 turn off and at least one of the NMOS transistors 22_1 to 22_n of the first switching circuit 20 as well as the second switching circuit transistor 25_1 turn on. At this time, because the transmission gate 21_3 and 25_2 of the transmission gate 40 turns on, the fifth node ND15 also goes low. Accordingly, the redundancy addressing signal REDn goes low and the corresponding redundant memory cell is activated.

As illustrated so far, even if the clock signal CLK is changed to the low level without address resetting, output of the fuse circuit REDn is not changed while the first node ND11 is precharged. This enables a dynamic fuse circuit having a small layout area to be applied to memory devices operating at high addressing speed.

<The Second Embodiment>

Figure 7:
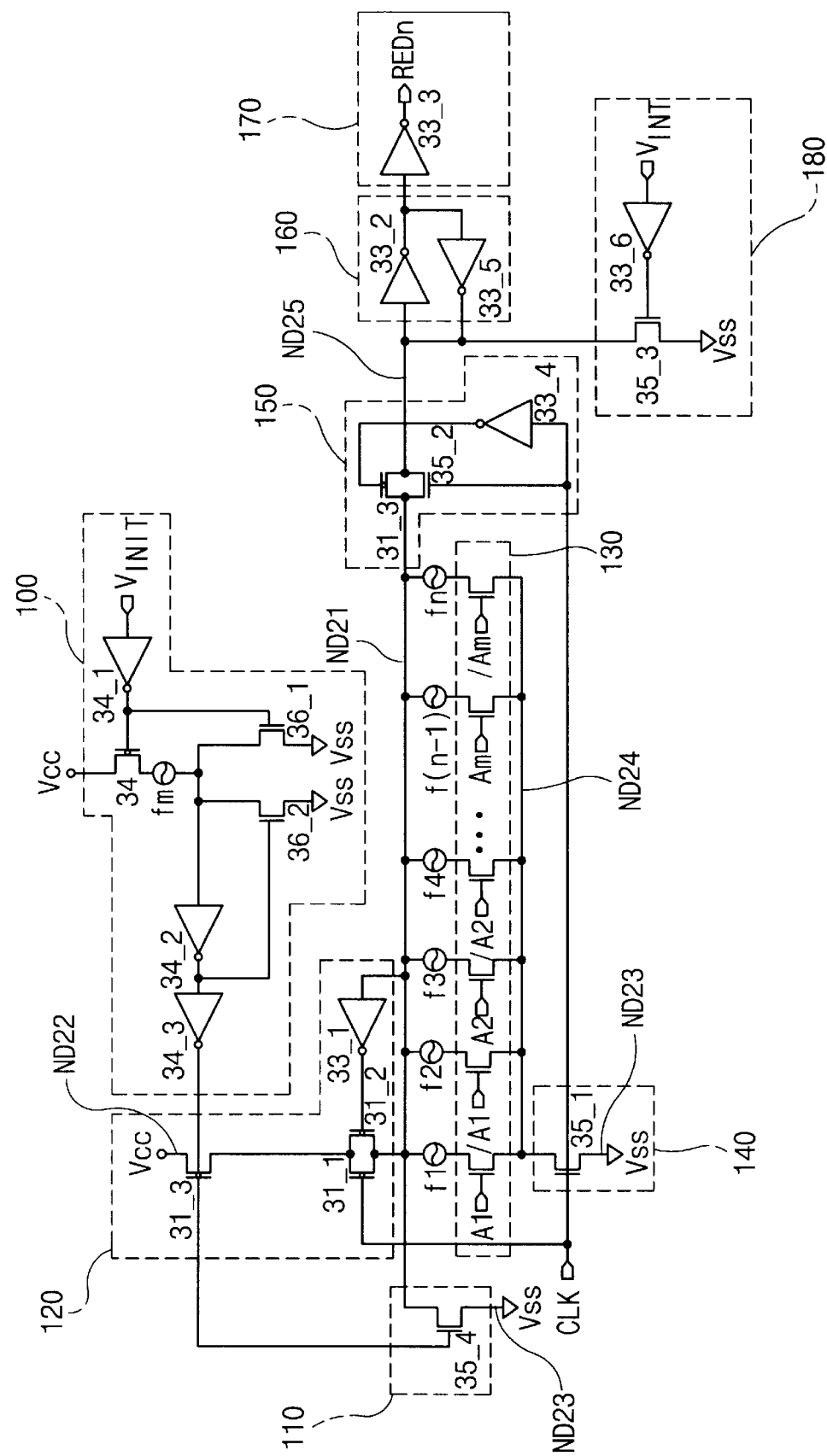
FIG. 7 is a circuit diagram of a redundancy circuit according to another embodiment of the present invention.

FIG. 7 shows another embodiment of the present invention. Comparing with the previous embodiment, a control signal generating circuit 100 and two switching circuits are additionally comprised in this embodiment. The control signal generating circuit 100 comprises a master fuse fm. When the master fuse fm is in a closed state, the control signal generating circuit 100 outputs a high control signal in response to the input of an initiating signal $V_{INIT}$. On the contrary, if the master fuse fm is opened, the control signal from the control signal generating circuit 100 becomes low in response to the input $V_{INIT}$.

The first switching circuit 110 has a terminal for receiving the control signal, so that the first node ND21 and the third node ND23 can be connected depending on the voltage level of the control signal.

A precharging circuit 120 connected between the first and the second nodes ND21 and ND22 receives both the control signal and a clock signal CLK. When the control signal from the control signal generating circuit 100 and the clock signal CLK are low, the first node ND21 is precharged to Vcc by the precharging circuit 120.

Between the first node ND21 and the second switching circuit 130 is connected in parallel to a plurality of slave fuses f1 to fn. The second switching circuit 130 is to electrically connect or disconnect the slave fuses and the fourth node ND24 depending on address inputs A1, /A1, A2, /A2, . . . , Am and /Am.

The third switching circuit 140 connected between the third and the fourth nodes ND23 and ND24 is to switch the electrical connection condition of ND23 and ND24 depending on the level of the clock signal CLK.

On the other hand, the transmission gate 150 is connected between the first and the fifth nodes ND21 and ND25 so that the connection of the nodes ND21 and ND25 are determined by the level of the clock signal CLK. To the fifth node ND25 is connected a latching circuit 160 for preserving or latching a signal from the first node ND21. An output of the latching circuit 160 is driven into a redundancy addressing signal REDn through output driving circuit 170.

The fourth switching circuit 180 is connected between the third and the fifth nodes ND23 and ND25, and controls the electrical connection of the nodes ND23 and ND25 in response to the initiating signal $V_{INIT}$.

Figure 3:
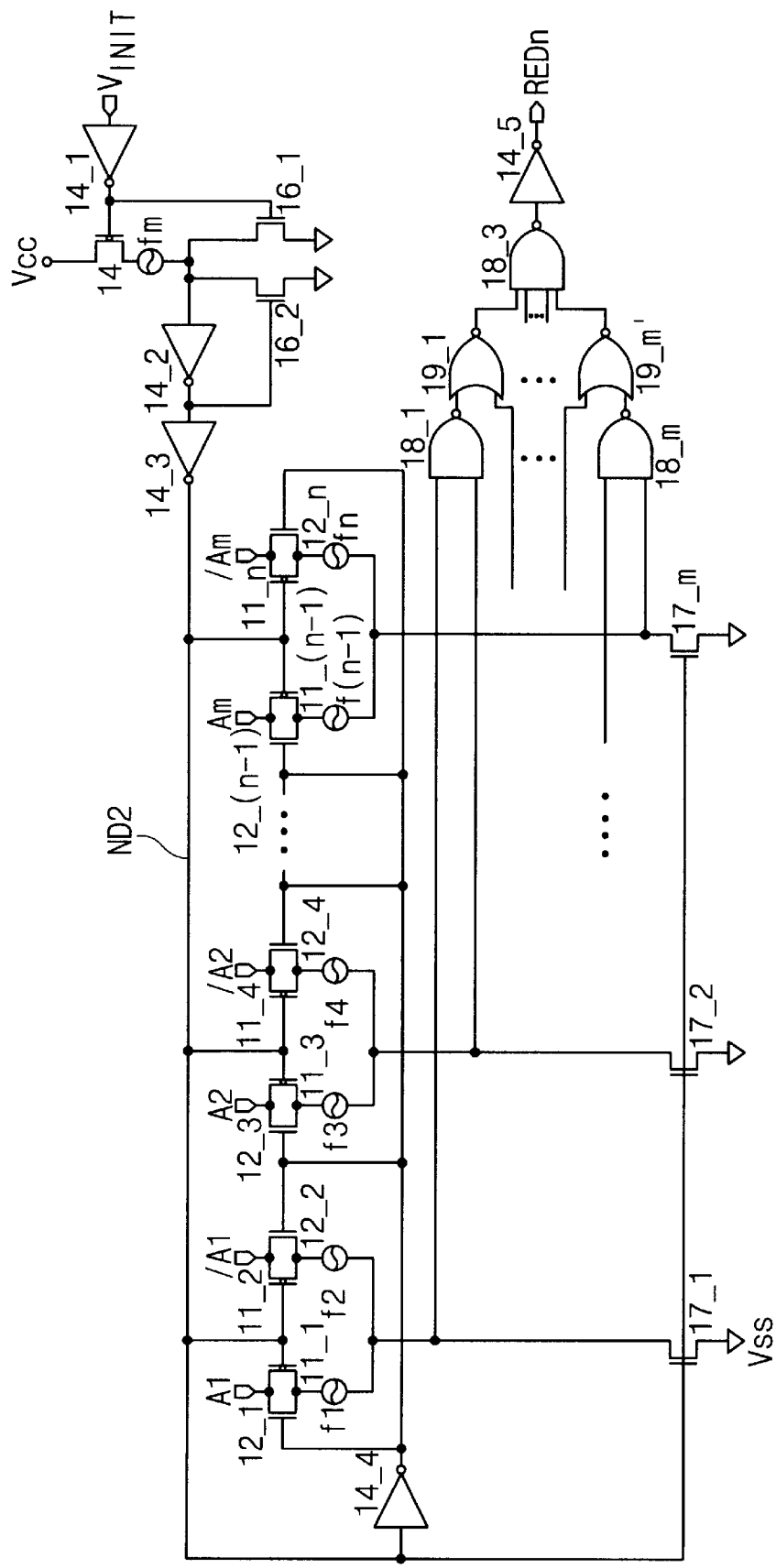
FIG. 3 is a circuit diagram of a conventional static fuse circuit used as a redundancy circuit.
Figure 4:
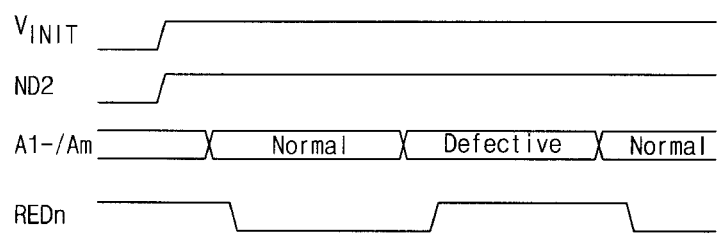
FIG. 4 is a timing diagram of various signals of the static fuse circuit of FIG. 3.

In FIG. 7, corresponding reference numerals refer to like parts of FIGS. 1, 3 and 5. For example, the element 1_1 of FIG. 1 corresponds to the element 31_1 of FIG. 7, and the element 14_1 of FIG. 3 and the element 34_1 of FIG. 7 can be regarded as elements performing like functions.

Now, the operating of the exemplary redundancy circuit of FIG. 7 will be explained.

If a memory device employing the redundancy circuit is found to have no defective element and there is no need to use redundant memory cells, the master fuse fm in the control signal generating circuit 100 and the slave fuses f1 to fn are not cut off but in closed states. Therefore, when the initiating signal $V_{INIT}$ (or, a certain control signal having active high voltage value) is supplied, the control signal generating circuit 100 outputs a high control signal and the NMOS transistor 35_3 of the fourth switching circuit 180 turn off. The first node ND21 goes low (Vss) due to the fact that the high control signal causes PMOS transistor 31_3 to turn off and NMOS transistor 35_4 to turn on. In the meanwhile, the voltage signal placed on the first node ND21 can be transferred to the fifth node ND25 only when the clock signal CLK remains high. However, after the CLK is changed to low, the ND25 can maintain its previous low voltage level by the latching circuit 160. As a result, the fifth node ND25 remains low as long as the NMOS transistor 35_3 of the fourth switching circuit 180 is kept to turn off, which results in an inactive signal of output of REDn.

On the other hand, if a situation where redundant memory cells are to replace defective elements is occurred, half the slave fuses f1 to fn and the master fuse fm are cut off. Like the previous examples, let's suppose that the defective element has address A1, A2, . . . , Am−1 and Am of '10 . . . 11'. Then among the slave fuses f1 to fn, a fuse f2 and fuses f3, f5, f7, . . . , fn−1 (i.e., fuses having subscripts of odd numbers greater than two) and the master fuse fm must be cut off.

When the initiating signal $V_{INIT}$ is not supplied and the clock signal CLK goes low, the control signal generating circuit 100 outputs low control signal, which causes NMOS transistor 35_4 of the first switching circuit 110 to turn off and PMOS transistor 31_1 of the precharging circuit 120 to turn on. Therefore the first node ND21 is connected to Vcc and precharged to high voltage. And, NMOS transistor 35_1 of the third switching circuit 140 and transistor 31_3 of the transmission gate 150 are all in nonconducting states, which makes the first and the fifth nodes ND21 and ND25 to be disconnected. At this time, the voltage value of the fifth node ND25 cannot maintain its previous value but is discharged low through the conduction of the NMOS transistor 35_3 of the fourth switching circuit 180 because of the low $V_{INIT}$. As a result, the redundancy addressing signal REDn from the output driving circuit 170 becomes low inactive.

In the meantime, if the clock signal goes low with the initiating signal $V_{INIT}$ being supplied, the output of the control signal generating circuit 100 still remains low, because the master fuse fm is opened and, hence, the turned-on PMOS transistor 34 cannot provide positive charges through the opened fuse. Accordingly, the first node ND21 remains high as before. However, the high voltage placed on ND21 cannot be transferred to the fifth node ND25, because the low clock signal makes the transmission gate 31_3 and 33_4 to turn off. As a result, the fifth node ND25 still maintains its previous low voltage value by the latching circuit 160 because the NMOS transistor 35_3 of the fourth switching circuit 180 is now in a nonconducting state.

Under this circumstance (i.e., during high ND21 and low REDn), if the clock signal CLK goes high without any resetting cycle of the address signal, all of the transistors 31_2 and 31_3 of the precharging circuit and the transistors 35_1, 31_3 and 35_2 of the third switching circuit 140 and the transmission gate 150 turn on. Therefore, the first and the fifth nodes ND21 and ND25 are electrically connected, which causes the fifth node ND25 to go high like ND2. As a result, the output driving circuit 170 supplies high voltage signal REDn, which results in activation of the redundant memory cell.

At this time, it should be noted that the just above situation is when a defective address associated with a defective memory cell is received through the gates of the second switching transistors. In other word, the first node ND21 can be isolated from the ground Vss terminal and, as a result, can maintain its high voltage level, because the paths between ND21 and Vss are blocked by selectively cutting the slave fuses that are associated with the address bits of high ('1') as explained before. Of course, it can be understandable that when normal address signal is supplied with the predetermined parts of the salve fuses being cut off, at least one NMOS transistor of the second switching circuit 130 turns on and an electrical path from ND21 to Vss via the conducted NMOS transistor 35_1 can be formed, which causes the first node ND21 and, in turn, the fifth node ND25 goes low resulting in inactive low REDn.

When the clock CLK returns to low voltage during the redundancy addressing signal REDn from the output driving circuit 170 remains high, the first and the fifth nodes ND21 and ND25 are disconnected by the transmission gate 150. However, the signal REDn is unchanged and maintains its previous high voltage due to the latching circuit 160. Accordingly, corresponding redundant memory cell is activated.

On the other hand, if next normal address bits are input to the second switching circuit 130 and the clock CLK goes high with the nodes ND21 and ND25 being high, at least one of the transistors in the second switching circuit 130 and transistors 35_1, 313 and 35_2 of the third and the fourth switching circuits 140 and 150 turn on, which makes the nodes ND21 and ND25 to go low. Accordingly, the redundancy addressing signal REDn goes low, and the redundant memory cell is not selected instead normal word line or bit line is activated.

As explained so far, with the present invention it is possible to make the redundancy circuit for activating redundant memory cells in place of defective memory cells in a semiconductor memory device to have smaller layout area and to be suitable for use in a high frequency addressing technique.

While the above description provides a full and complete disclosure of the preferred embodiments of the invention, various modifications, alternate constructions and equivalents may be employed as desired. Therefore, the above description and illustrations should not be construed as limiting the invention, which is defined by the appended claims.

What is claimed is:

1. A redundancy circuit providing a redundancy addressing signal for activating redundant memory cells in place of defective memory cells in a semiconductor memory device, said redundancy circuit comprising:

an input node for receiving a control signal;

a first node for determining a voltage level of the redundancy addressing signal;

a programming means for programming repair information of the defective memory cells, the programming means being connected between the first node and a second node;

precharging means for precharging said first node to a first voltage supply level, said precharging means being connected between said first node, a third node, and the input node, the third node for receiving a first voltage supply;

first switching means for discharging said first node to a second voltage supply, said first switching means being connected between the second node, a fourth node, and the input node, the fourth node for receiving the second voltage supply; and transmission means connected for transferring the voltage level of said first node to a redundancy addressing signal terminal, whereby the precharging means, the first switching means, and the transmission means are responsive to the single control signal.

2. The redundancy circuit of claim 1 further comprising a latching means connected between the transmission means and said redundancy addressing signal terminal for maintaining the voltage level of the redundancy addressing signal and a driving means connected between said latching means and said redundancy addressing signal terminal.

3. The redundancy circuit of claim 1 wherein the first switching means comprises an NMOS transistor having a gate electrode receiving the control signal, a drain electrode connected to the second node, and a source electrode receiving the second voltage supply.

4. The redundancy circuit of claim 1 wherein said programming means comprises:
   a plurality of fuses connected at a first end to said first node; and
   second switching means for uncoupling said first node from said second node responsive to a defective memory cell address signal, said second switching means being connected between the second node and a second end of said plurality of fuses.

5. The redundancy circuit of claim 4 wherein said second switching means comprises a plurality of NMOS transistors each having a gate electrode receiving one bit of the defective memory cell address signal, a drain electrode connected to the second end of a corresponding fuse of said plurality of fuses, and a source electrode connected to the second node.

6. The redundancy circuit of claim 4 wherein among said plurality of fuses, the fuses associated with an address signal bit having a voltage level equal to the first voltage supply level are cut off.

7. The redundancy circuit of claim 5 wherein among said plurality of fuses, the fuses connected to the NMOS transistors of the second switching means which receive address bits having a voltage level equal to the first voltage supply are cut off.

8. The redundancy circuit of claim 1, wherein said control signal is a clock signal.

9. The redundancy circuit of claim 2 wherein said latching means comprises a first and a second inverter, the first inverter connected in parallel opposite direction to the second inverter.

10. The redundancy circuit of claim 2 wherein said transmission means comprises:
   an inverter connected at an input end to said input node; and
   a transmission gate having one control electrode connected to said input node and another control electrode connected to an output end of said inverter, said transmission gate being connected between the first node and said latching means.

11. The redundancy circuit of claim 2 wherein the transmission means includes a CMOS transmission gate responsive to the control signal.

12. The redundancy circuit of claim 2 further comprising signal buffer means for buffering the redundancy addressing signal output from the latching means.

13. A redundancy circuit providing a redundancy addressing signal for activating redundant memory cells in place of defective memory cells in a semiconductor memory device, said redundancy circuit comprising:
   a first node for determining a voltage level of the redundancy addressing signal;
   precharging means for precharging said first node to a first voltage supply level responsive to an internal and a first control signal of the semiconductor memory device, said precharging means being connected to said first node and having a second node for receiving a first voltage supply;
   a plurality of fuses each connected at a first end to said first node;
   first switching means for uncoupling said first node and a fourth node responsive to a defective memory cell address signal, said first switching means being connected between the fourth node and a second end of each of said plurality of fuses; and
   second switching means for discharging said first node to a second voltage supply level responsive to the first control signal, said second switching means connected between the fourth node and a second voltage supply.

14. The redundancy circuit of claim 13, wherein said precharging means comprises:
   a first PMOS transistor having a source electrode connected to the first voltage supply, a gate electrode for receiving the internal control signal, and a drain electrode;
   a second PMOS transistor having a source electrode connected to the drain electrode of the first PMOS transistor, a gate electrode receiving the first control signal, and a drain electrode connected to the first node;
   a third PMOS transistor having a source electrode connected to the drain electrode of the first PMOS transistor, a gate electrode, and a drain electrode connected to the first node; and
   an inverter connected between the gate electrode of the third PMOS transistor and the first node.

15. The redundancy circuit of claim 13, wherein the second switching means comprises an NMOS transistor having a source electrode receiving the second voltage supply, a gate electrode receiving the first control signal, and a drain electrode connected to the fourth node.

16. The redundancy circuit of claim 13, wherein the first control signal is a clock signal.

17. The redundancy circuit of claim 13, wherein the first switching means comprises a plurality of NMOS transistors each having a gate electrode receiving one bit of the defective memory cell address signal, a drain electrode connected to a corresponding fuse of said plurality of fuses, and a source electrode connected to the fourth node.

18. The redundancy circuit of claim 17, wherein among said plurality of fuses, the fuses associated with the NMOS transistors of the first switching means which receive address bits having a voltage level equal to the first voltage supply level are cut off.

19. The redundancy circuit of claim 13 further comprising a control circuit for generating the internal control signal responsive to a second control signal, the control circuit coupled to the precharging means.

20. The redundancy circuit of claim 19 wherein the control circuit further comprises:
   an inverter receiving the second control signal;
   a PMOS transistor having a source electrode receiving the first voltage supply, a gate electrode connected to an output of the inverter, and a drain electrode;
   a master fuse connected to the drain electrode of the PMOS transistor; and
   an NMOS transistor having a source electrode receiving the second voltage supply, a gate electrode connected to the output of the inverter, and a drain electrode connected to the master fuse.

21. The redundancy circuit of claim 19 further comprising third switching means connected between the first node and the second voltage supply.

22. The redundancy circuit of claim 21 wherein the third switching means comprises an NMOS transistor having a drain electrode connected to the first node, a gate electrode receiving the internal control signal, and a source electrode receiving the second voltage supply.

23. The redundancy circuit of claim 21 further comprising fourth switching means for discharging the fifth node responsive to the second control signal.

24. The redundancy circuit of claim 23 wherein the fourth switching means comprises:
   an inverter receiving the second control signal; and an NMOS transistor having a source electrode connected to a second voltage supply, a gate electrode connected to an output of the inverter, and a drain electrode connected to the fifth node.

25. The redundancy circuit of claim 23 further comprising a transmission gate for connecting the first node to a fifth node responsive to the first control signal.

26. The redundancy circuit of claim 25 further comprising latching means for maintaining the voltage level of the redundancy addressing signal, the latching means including a first and a second inverter, the first inverter connected in parallel opposite direction to the second inverter.

27. The redundancy circuit of claim 25, wherein the transmission gate comprises:

an NMOS transistor having a source electrode connected to the first node, a gate electrode receiving the first control signal, and a drain electrode connected to the fifth node; and a PMOS transistor having a source electrode connected to the fifth node, a gate electrode receiving an inverted signal of the first control signal, and a drain electrode connected to the first node.

28. A method for providing a redundancy addressing signal for activating redundant memory cells in place of defective memory cells in a semiconductor memory device, the memory device having a plurality of fuses and a first and second switching circuits, the method comprising:

precharging a first node to a voltage level responsive to a control signal;

receiving a memory cell address to the first switching circuit, the first switching circuit having a plurality of switching elements, each of the plurality of switching elements receiving a memory cell address bit;

connecting the first node to a redundancy address signal terminal such that the voltage level of the first node is substantially equal to a voltage level of the redundancy address signal responsive to the control signal;

disconnecting the first node from the redundancy address signal terminal responsive to the control signal; and maintaining the voltage level of the redundancy address signal with a latching circuit.

29. The method for providing a redundancy addressing signal of claim 28 further comprising the step of opening some of the plurality of fuses when the memory cell address signal is of a defective memory cell.

30. The method for providing a redundancy addressing signal of claim 29 wherein the fuses that are open are those fuses associated with logic high address bits.

31. The method for providing a redundancy addressing signal of claim 29 further comprising the step of discharging the first node through a second switching circuit when the memory cell address signal is of a non-defective memory cell.

32. A method for providing a redundancy address signal for replacing defective memory cells for redundant memory cells in a semiconductor memory device, the method comprising:

generating an internal control signal responsive to a second control signal;

precharging a first node to a first voltage supply level responsive to a first voltage level of the internal control signal and to a first control signal;

providing a memory cell address signal for the defective memory cell to a first switching circuit;

coupling the first node to a redundancy addressing signal node responsive to a first voltage level of the first control signal such that a voltage level of the first node is substantially equal to a voltage level of the redundancy addressing signal; and decoupling the first node from the redundancy signal node responsive to a second voltage level of the first control signal.

33. The method for providing a redundancy addressing signal of claim 32 wherein the first switching circuit comprises a plurality of switching elements, each of the plurality of switching elements having a first end connected to a corresponding fuse of a plurality of fuses and receiving a single bit of the memory cell address signal.

34. The method for providing a redundancy addressing signal of claim 33 further comprising the step of opening each of the fuses associated with a logic high memory cell address bit.

35. The method for providing a redundancy addressing signal of claim 33 further comprising the step of coupling a second end of the plurality of switching elements to a second voltage supply.

36. The method for providing a redundancy addressing signal of claim 35 further comprising the step of discharging the first node to the second voltage supply responsive to a second voltage level of the internal control signal.

37. The method for providing a redundancy addressing signal of claim 36 further comprising the step of maintaining the voltage level of the signal node by using a latching circuit.

38. The method for providing a redundancy addressing signal of claim 37 further comprising the step of discharging the redundancy addressing signal node responsive to the second control signal.

* * * * *